US010862476B2

(12) United States Patent
Kakubari (10) Patent No.: US 10,862,476 B2
(45) Date of Patent: Dec. 8, 2020

(54) SEMICONDUCTOR DEVICE AND ELECTRONIC DEVICE USING THE SAME

(71) Applicant: SEIKO EPSON CORPORATION, Tokyo (JP)

(72) Inventor: Hideyuki Kakubari, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 297 days.

(21) Appl. No.: 15/913,088

(22) Filed: Mar. 6, 2018

(65) Prior Publication Data

US 2018/0262189 A1 Sep. 13, 2018

(30) Foreign Application Priority Data

Mar. 10, 2017 (JP) ................................ 2017-045785

(51) Int. Cl.
| | | |
|---|---|---|
| *H03K 17/16* | (2006.01) | |
| *H01L 27/092* | (2006.01) | |
| *H03K 17/06* | (2006.01) | |
| *H01L 21/8238* | (2006.01) | |

(52) U.S. Cl.
CPC ....... *H03K 17/162* (2013.01); *H01L 27/0928* (2013.01); *H03K 17/06* (2013.01); *H01L 21/823892* (2013.01); *H03K 2017/066* (2013.01); *H03K 2217/0036* (2013.01)

(58) Field of Classification Search
CPC ......... H03K 17/08104; H03K 17/0822; H03K 17/161; H03K 17/162; H03K 17/165; H03K 17/6872; H03K 19/00315; H03K 19/00361; H03K 2017/066; H03K 2217/0036; H01L 21/823892; H01L 27/0928
See application file for complete search history.

(56) References Cited

U.S. PATENT DOCUMENTS

| | | | | | |
|---|---|---|---|---|---|
| 4,847,522 | A | * | 7/1989 | Fuller | .................. H03K 17/102 326/58 |
| 5,966,038 | A | * | 10/1999 | Langer | ............. H03K 19/00315 327/313 |
| 6,144,221 | A | * | 11/2000 | Oshima | ............ H03K 19/00315 326/62 |
| 7,477,075 | B2 | * | 1/2009 | Kesselring | ....... H03K 19/00315 326/82 |
| 2009/0225482 | A1 | | 9/2009 | Nakahara | |

FOREIGN PATENT DOCUMENTS

| | | |
|---|---|---|
| JP | 2009-218296 A | 9/2009 |
| JP | 2012-142688 A | 7/2012 |
| JP | 2015-207901 A | 11/2015 |

* cited by examiner

*Primary Examiner* — Patrick O Neill
(74) *Attorney, Agent, or Firm* — Oliff PLC (57) ABSTRACT

A semiconductor device provided with a first node to which a first power supply potential is supplied, a second node to which a second power supply potential lower than the first power supply potential is supplied, a signal terminal configured to be used in order to at least output a signal, an output driver including a first output element configured to supply the first power supply potential to the signal terminal when in an ON state, and a second output element provided in a P-well electrically separated from a semiconductor substrate and configured to supply the second power supply potential to the signal terminal when in an ON state, and a switch circuit configured to selectively supply a potential to the P-well, according to at least a potential of the signal terminal.

13 Claims, 4 Drawing Sheets

SEMICONDUCTOR DEVICE AND ELECTRONIC DEVICE USING THE SAME

CROSS REFERENCE

This application claims priority to Japanese Patent Application No. 2017-045785, filed Mar. 10, 2017, the entire disclosure of which is expressly incorporated herein by reference.

BACKGROUND

1. Technical Field

The present disclosure relates to a semiconductor device, and more particularly to a semiconductor device having a tolerant function. Furthermore, the disclosure relates to an electronic device or the like that uses such a semiconductor device.

2. Related Art

For example, there are cases where an external circuit that operates at a higher voltage than a power supply voltage of a semiconductor device is connected to a signal terminal of the semiconductor device. In such cases, when leakage current flows between the semiconductor device and the external circuit, there is a risk that the power supply voltage of the semiconductor device will fluctuate, causing internal circuitry to malfunction or circuit elements to break down. In view of this, a tolerant function is provided in the semiconductor device, in order to prevent leakage current.

As a related technology, JP-A-2015-207901 (paras. 0001 to 0007; FIG. 1) discloses an output circuit in a semiconductor integrated circuit that acts as an interface between the semiconductor integrated circuit and a circuit configured to operate at a higher voltage than the power supply voltage, and that is able to prevent leakage current from occurring in the case where a potential in a vicinity of the power supply voltage of the output circuit is applied to the output terminal. This output circuit has a first P-channel transistor connected between the output terminal and the power supply voltage, and is provided with a leakage current prevention unit capable of receiving a gate signal of a first P-channel transistor via another P-channel transistor, an N-channel transistor and an N-channel depression transistor.

As disclosed in JP-A-2015-207901 (paras. 0001 to 0007; FIG. 1), a tolerant circuit that prevents leakage current in the case where a potential higher than the power supply potential on the high potential side that is supplied to a semiconductor device is applied to a signal terminal of the semiconductor device from outside is generally known. However, depending on the system specification, there are also cases where a potential lower than the power supply potential on the low potential side that is supplied to a semiconductor device is applied to the signal terminal of a semiconductor device from outside. For example, there are also cases where undershoot is included in the signal that is applied to the signal terminal of a semiconductor device. Accordingly, the ability to prevent leakage current in such cases is desired for semiconductor devices.

SUMMARY

In view of the above, an advantage of some aspects of the disclosure is to provide a semiconductor device that is able to prevent leakage current, even in the case where a potential lower than a power supply potential on a low potential side is applied to a signal terminal from outside. Also, an advantage of some aspects of the disclosure is to provide an electronic device or the like that uses such a semiconductor device.

According to a first aspect of the disclosure, a semiconductor device includes a first node to which a first power supply potential is supplied, a second node to which a second power supply potential lower than the first power supply potential is supplied, a signal terminal configured to be used in order to at least output a signal, an output driver including a first output element configured to supply the first power supply potential to the signal terminal when in an ON state, and a second output element provided in a P-well electrically separated from a semiconductor substrate and configured to supply the second power supply potential to the signal terminal when in an ON state, and a switch circuit configured to selectively supply a potential to the P-well, according to at least a potential of the signal terminal.

According to the first aspect of the disclosure, the second output element of the output driver is provided in a P-well electrically separated from the semiconductor substrate, and a switch circuit selectively supplies a potential to the P-well, according to at least the potential of the signal terminal. Accordingly, in the case where a potential lower than the second power supply potential on the low potential side is applied to the signal terminal from outside, the P-well is electrically separated from the second node, and leakage current can be prevented from flowing to the signal terminal from the second node via the second output element. As a result, it is possible to prevent malfunction of internal circuitry or breakdown of circuit elements of the semiconductor device.

Here, the switch circuit may supply the second power supply potential to the P-well, when the potential of the signal terminal at or above the second power supply potential, and maintain the second output element in an OFF state by supplying a potential to the P-well and a control terminal of the second output element from the signal terminal, when the potential of the signal terminal is lower than the second power supply potential by greater than or equal to a predetermined value.

It is thereby possible, at the time of normal operation, to stabilize the operation of internal circuitry by supplying the second power supply potential to the P-well, and, in the case where a potential lower than the second power supply potential by greater than or equal to a predetermined value is applied to the signal terminal from outside, to prevent leakage current by cutting off the second output element.

Also, the switch circuit may include a first transistor connected between the second node and the P-well, and configured to supply the second power supply potential to the P-well, when the potential of the signal terminal is higher than the second power supply potential by greater than or equal to a threshold voltage, a second transistor connected between the second node and the P-well, and configured to supply the second power supply potential to the P-well, when the potential of the control terminal of the second output element is higher than the second power supply potential by greater than or equal to a threshold voltage, and a third transistor connected between the signal terminal and the P-well, and configured to supply a potential to the P-well from the signal terminal, when the potential of the signal terminal is lower than the second power supply potential by greater than or equal to a threshold voltage.

In this way, by providing the first to third transistors, it is possible, at the time of normal operation, to supply the second power supply potential to the P-well even if the potential of the signal terminal transitions between high level and low level, and, when the potential of the signal terminal is lower than the second power supply potential by greater than or equal to a threshold voltage of the third transistor, to supply the potential of the signal terminal to the P-well.

Furthermore, the switch circuit may include a fourth transistor connected between the P-well and a control terminal of the second output element and between the P-well and a gate of the second transistor, and configured to maintain the second output element and the second transistor in an OFF state by supplying a potential to the control terminal of the second output element and the gate of the second transistor from the P-well, when the potential of the P-well is lower than the second power supply potential by greater than or equal to a threshold voltage. Leakage current can thereby be prevented by cutting off the second output element and the second transistor, when the potential of the P-well is lower than the second power supply potential by greater than or equal to a threshold voltage of the fourth transistor.

In the above, the semiconductor device may further include a pre-driver configured to drive the second output element in accordance with a low-side drive signal, and the pre-driver may include a P-channel transistor connected between the first node and a control terminal of the second output element, and configured to supply the first power supply potential to the control terminal of the second output element, when the low-side drive signal is low level, a first N-channel transistor and a second N-channel transistor connected in series between the control terminal of the second output element and the second node, the first N-channel transistor being configured to enter an ON state in accordance with a bias potential that is supplied to a third node, and the second N-channel transistor being configured to supply the second power supply potential to the control terminal of the second output element via the first N-channel transistor, when the low-side drive signal is high level, and a third N-channel transistor connected between the third node and the P-well, and configured to maintain the first N-channel transistor in an OFF state by reducing the potential of the third node to the potential of the P-well, when the potential of the P-well is lower than the second power supply potential by greater than or equal to a threshold voltage. Leakage current can thereby be prevented by cutting off the first N-channel transistor, when the potential of the P-well is lower than the second power supply potential by greater than or equal to a threshold voltage of third N-channel transistor.

In that case, the semiconductor device may further include a bias potential supply circuit configured to supply the bias potential to the third node in accordance with a control signal, and the bias potential supply circuit may include a second P-channel transistor connected between the first node and the third node, and configured to supply current when the control signal is low level, and a plurality of P-channel transistors connected in series between the third node and the second node, having a gate connected to a drain, and configured to generate the bias potential in the third node upon supply of a current from the second P-channel transistor.

As long as the control signal is high level, leakage current can thereby be prevented from flowing in the bias potential supply circuit, even if the potential of the P-well becomes lower than the second power supply potential by greater than or equal to the threshold voltage of third N-channel transistor, and the third N-channel transistor is in an ON state in the pre-driver.

Also, the first output element may be provided in an N-well electrically separated from the semiconductor substrate, and the semiconductor device may further include a second switch circuit configured to selectively supply a potential to the N-well, according to at least the potential of the signal terminal. Leakage current can thereby be prevented from flowing to the first node from the signal terminal via the first output element by electrically separating the N-well from the first node, in the case where a potential higher than the first power supply potential on the high potential side is applied to the signal terminal from outside. As a result, it is possible to prevent malfunction of internal circuitry and breakdown of circuit elements of the semiconductor device.

Furthermore, the semiconductor device may include an input circuit configured to input a signal from the signal terminal. The signal terminal can thereby be used as an input/output terminal that outputs and inputs signals.

An electronic device according to a second aspect of the disclosure includes a semiconductor device according to any of the above, and a second semiconductor device configured to operate based on a signal that is output from the signal terminal of the semiconductor device. A highly reliable electronic device or the like can thereby be provided, using a semiconductor device that is able to prevent malfunction of internal circuitry and breakdown of circuit elements due to leakage current that occurs in the case where a potential lower than the second power supply potential on the low potential side or higher than the first power supply potential on the high potential side is applied to the signal terminal.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, embodiments of the disclosure will be described in detail, with reference to the drawings. Note that the same reference signs are given to constituent elements that are the same, and redundant description will be omitted.

First Embodiment

Figure 1:
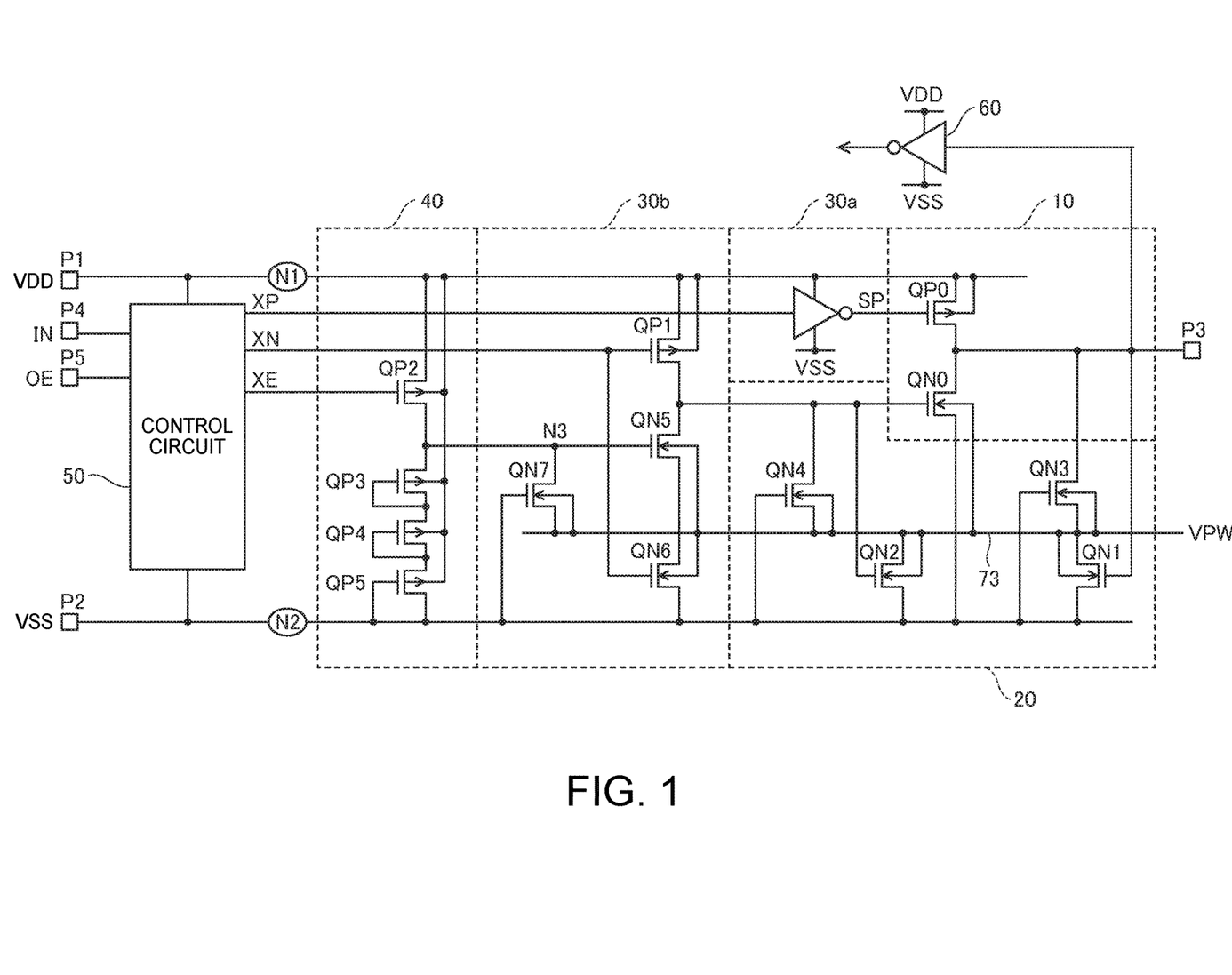
FIG. 1 is a circuit diagram showing configuration example of a semiconductor device according to one embodiment.

FIG. 1 is a circuit diagram showing a configuration example of a semiconductor device according to a first embodiment of the disclosure. As shown in FIG. 1, this semiconductor device includes an output driver 10, a switch circuit 20, a pre-driver 30a on the high side, a pre-driver 30b on the low side, a bias potential supply circuit 40, a control circuit 50, and a plurality of terminals (pads) P1 to P5, and may further include an input circuit 60.

A first power supply potential VDD is supplied to a first node N1 of the semiconductor device from a power supply terminal P1. Also, a second power supply potential VSS lower than the first power supply potential VDD is supplied to a second node N2 of the semiconductor device from a power supply terminal P2. One of the first power supply potential VDD and the second power supply potential VSS may be a ground potential (0V).

A signal terminal P3 is used in order to at least output signals. In the example shown in FIG. 1, the signal terminal P3 is connected to the output driver 10 and the input circuit 60. In that case, the input circuit 60 inputs signals from the signal terminal P3, and supplies the input signals to a downstream circuit. The signal terminal P3 can thereby be utilized as an input/output terminal that outputs and inputs signals.

Output Driver

The output driver 10 includes, for example, a P-channel MOS transistor QP0 as a first output element and an N-channel MOS transistor QN0 as a second output element. At the time of normal operation, the output driver 10 inverts the level of the signal that is supplied to gates of the transistors QP0 and QN0, and supplies an output signal having the inverted level to the signal terminal P3.

The transistor QP0 has a source connected to the first node N1, a drain connected to the signal terminal P3, and a gate to which an output signal SP of the pre-driver 30*a* on the high side is supplied, and supplies the first power supply potential VDD to the signal terminal P3 when in an ON state.

The transistor QN0 has a drain connected to the signal terminal P3, a source connected to the second node N2, and a gate to which an output signal SN of the pre-driver 30*b* on the low side is supplied, and supplies the second power supply potential VSS to the signal terminal P3 when in an ON state.

Here, a PN junction (parasitic diode) is formed by the back gate and drain of the transistor QN0. In the case where the back gate of the transistor QN0 is connected to the second node N2, leakage current will flow toward the signal terminal P3 from the second node N2 via the parasitic diode when a potential lower than the second power supply potential VSS by greater than or equal to a forward voltage of the parasitic diode is applied to the signal terminal P3 from outside.

In order to prevent this, in the present embodiment, the transistor QN0 is provided in a P-well (floating P-well) 73 electrically separated from the semiconductor substrate. That is, the back gate of the transistor QN0 is constituted by the P-well 73, and the transistor QN0 has a tolerant function.

Switch Circuit

The switch circuit 20 selectively supplies a potential to the P-well 73, according to at least the potential of the signal terminal P3. Accordingly, in the case where a potential lower than the second power supply potential VSS on the low potential side is applied to the signal terminal P3 from outside, leakage current can be prevented from flowing to the signal terminal P3 from the second node N2 via the transistor QN0, by electrically separating the P-well 73 from the second node N2. As a result, it is possible to prevent malfunction of internal circuitry and breakdown of circuit elements of the semiconductor device.

For example, the switch circuit 20 may be configured to supply the second power supply potential VSS to the P-well 73, when the potential of the signal terminal P3 is at or above the second power supply potential VSS, and to maintain the transistor QN0 in an OFF state by supplying a potential to the P-well 73 and the gate of the transistor QN0 (control terminal of the second output element) from the signal terminal P3, when the potential of the signal terminal P3 is lower than the second power supply potential VSS by greater than or equal to a predetermined value. Note that the above predetermined value corresponds to a threshold voltage of an N-channel MOS transistor which will be discussed later.

It is thereby possible, at the time of normal operation, to stabilize the operation of internal circuitry by supplying the second power supply potential VSS to the P-well 73, and, in the case where the operation of the a potential lower than the second power supply potential VSS by greater than or equal to a predetermined value is applied to the signal terminal P3 from outside, to prevent leakage current by cutting off the transistor QN0.

In the example shown in FIG. 1, the switch circuit 20 includes N-channel MOS transistors QN1 to QN4 as first to fourth transistors. For example, the potential of back gates of the transistors QN1 to QN4 is configured to be the same as a potential VPW of the P-well 73, by providing the transistors QN1 to QN4 in the P-well 73 similarly to the transistor QN0.

The transistor QN1 is connected between the second node N2 and the P-well 73, and the potential of the signal terminal P3 is supplied to the gate thereof. The transistor QN1 supplies the second power supply potential VSS to the P-well 73, when the potential of the signal terminal P3 is higher than the second power supply potential VSS by greater than or equal to a threshold voltage.

The transistor QN2 is connected between the second node N2 and the P-well 73, and the gate potential of the transistor QN0 is supplied to the gate thereof. The transistor QN2 supplies the second power supply potential VSS to the P-well 73, when the gate potential of the transistor QN0 is higher than the second power supply potential VSS by greater than or equal to a threshold voltage.

The transistor QN3 is connected between the signal terminal P3 and the P-well 73, and the second power supply potential VSS is supplied to the gate thereof. The transistor QN3 supplies a potential to the P-well 73 from the signal terminal P3, when the potential of the signal terminal P3 is lower than the second power supply potential VSS by greater than or equal to a threshold voltage.

Figure 2:
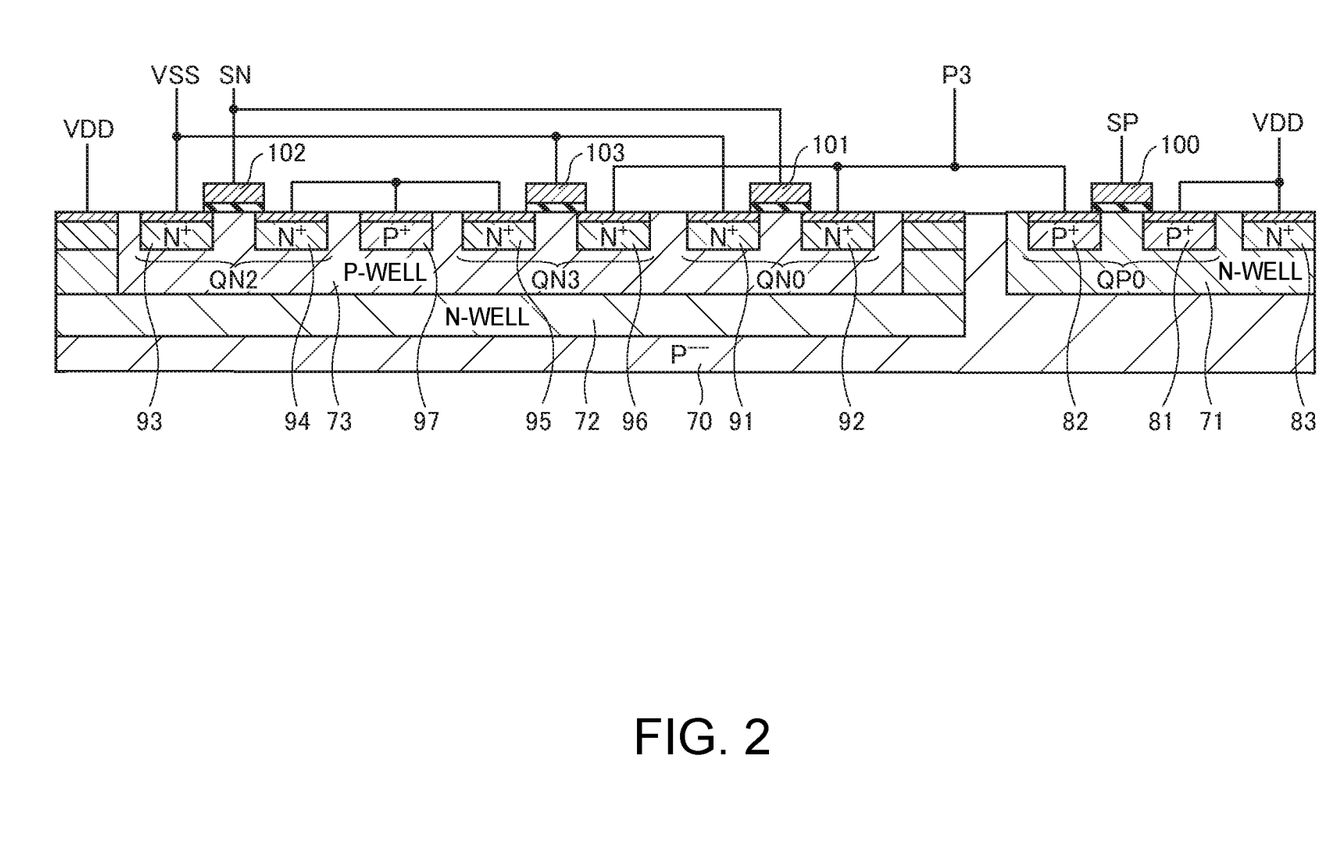
FIG. 2 is a cross-sectional view showing part of the semiconductor device shown in FIG. 1.

FIG. 2 is a cross-sectional view showing part of the semiconductor device shown in FIG. 1. Elements constituting part of the output driver 10 and the switch circuit 20 shown in FIG. 1 are shown in FIG. 2. For example, N-wells 71 and 72 are formed within a P-type semiconductor substrate 70, and the P-well 73 is formed within the N-well 72. Here, the semiconductor substrate 70, the N-well 72 and the P-well 73 constitute a triple well structure.

P-type impurity regions 81 and 82 that serve as a source and a drain of the transistor QP0 and an N-type contact region 83 are formed in the N-well 71. The first power supply potential VDD is supplied to the P-type impurity region 81 and the N-type contact region 83, and the P-type impurity region 82 is electrically connected to the signal terminal P3.

N-type impurity regions 91 and 92 that serve as a source and a drain of the transistor QN0, N-type impurity regions 93 and 94 that serve as a source and a drain of the transistor QN2, N-type impurity regions 95 and 96 that serve as a source and a drain of the transistor QN3, and a P-type contact region 97 are formed in the P-well 73. The second power supply potential VSS is supplied to the N-type impurity regions 91 and 93, the N-type impurity regions 92 and 96 are electrically connected to the signal terminal P3, and the N-type impurity regions 94 and 95 are electrically connected to the P-well 73 via the P-type contact region 97.

A gate electrode 100 of the transistor QP0, a gate electrode 101 of the transistor QN0, a gate electrode 102 of the transistor QN2, and a gate electrode 103 of the transistor QN3 are disposed on the semiconductor substrate 70 via the gate insulation film. The output signal SP of the pre-driver 30a is supplied to the gate electrode 100 of the transistor QP0, the output signal SN of the pre-driver 30b is supplied to the gate electrode 101 of the transistor QN0 and the gate electrode 102 of the transistor QN2, and the second power supply potential VSS is supplied to the gate electrode 103 of the transistor QN3.

Referring again to FIG. 1, by providing the transistors QN1 to QN3, it is possible, at the time of normal operation, to supply the second power supply potential VSS to the P-well 73 even if the potential of the signal terminal P3 transitions between high level and low level, and, when the potential of the signal terminal P3 is lower than the second power supply potential VSS by greater than or equal to a threshold voltage of the transistor QN3, to supply the potential of the signal terminal P3 to the P-well 73.

Also, the transistor QN4 is connected between the P-well 73 and the gate of the transistor QN0 and between the P-well 73 and the gate of the transistor QN2, and the second power supply potential VSS is supplied to the gates thereof. The transistor QN4 maintains the transistors QN0 and QN2 in an OFF state, by supplying a potential to the gate of the transistor QN0 and the gate of the transistor QN2 from the P-well 73, when the potential VPW of the P-well 73 is lower than the second power supply potential VSS by greater than or equal to a threshold voltage. Leakage current can thereby be prevented by cutting off the transistors QN0 and QN2, when the potential VPW of the P-well 73 is lower than the second power supply potential VSS by greater than or equal to a threshold voltage of the transistor QN4.

Control Circuit and Pre-Drivers

The control circuit 50 generates a high-side drive signal XP and a low-side drive signal XN and sets a control signal XE to low level, based on an input signal IN that is supplied to the input terminal P4, when an output enabling signal OE that is supplied to the control terminal P5 has been activated. The high-side drive signal XP and the low-side drive signal XN are signals that are substantially in phase with the input signal IN, with the transition timing being adjusted in the output driver 10 such that the transistors QP0 and QN0 are not simultaneously in an ON state.

Also, the control circuit 50 respectively sets the high-side drive signal XP and the low-side drive signal XN to low level and high level, and sets the control signal XE to high level, when the output enabling signal OE has been deactivated. For example, the output enabling signal OE is activated when the semiconductor device outputs a signal from the signal terminal P3, and the output enabling signal OE is deactivated in all other cases.

The pre-driver 30a on the high-side drives the transistor QP0, in accordance with the high-side drive signal XP that is supplied from the control circuit 50. Also, the pre-driver 30b on the low-side drives the transistor QN0, in accordance with the low-side drive signal XN that is supplied from the control circuit 50.

In the example shown in FIG. 1, the pre-driver 30a on the high side includes an inverter, and inverts the high-side drive signal XP to generate the output signal SP. Also, the pre-driver 30b on the low side inverts the low-side drive signal XN to generate the output signal SN.

When the output enabling signal OE has been activated, the high-side drive signal XP and the low-side drive signal XN become high level when the input signal IN becomes high level, and thus the output signal SP of the pre-driver 30a and the output signal SN of the pre-driver 30b become low level. Accordingly, the output driver 10 supplies a high level output signal to the signal terminal P3.

Also, the high-side drive signal XP and the low-side drive signal XN become low level when the input signal IN becomes low level, and thus the output signal SP of the pre-driver 30a and the output signal SN of the pre-driver 30b become high level. Accordingly, the output driver 10 supplies a low level output signal to the signal terminal P3.

On the other hand, when the output enabling signal OE has been deactivated, the high-side drive signal XP becomes low level and the low-side drive signal XN becomes high level, irrespective of the level of the input signal IN, and thus the output signal SP of the pre-driver 30a becomes high level and the output signal SN of the pre-driver 30b becomes low level. Accordingly, the transistors QP0 and QN0 of the output driver 10 enter an OFF state, and the signal terminal P3 enters a high impedance state.

Pre-Driver on Low Side

The pre-driver 30b on the low side includes, for example, a P-channel MOS transistor QP1 and N-channel MOS transistors QN5 to QN7. For example, by providing the transistors QN5 to QN7 in the P-well 73 similarly to the transistor QN0, the potential of the back gates of the transistors QN5 to QN7 is configured to be the same as the potential VPW of the P-well 73.

The transistor QP1 is connected between the first node N1 and the gate of the transistor QN0, and the low-side drive signal XN is supplied to the gate thereof. The transistor QP1 supplies the first power supply potential VDD to the gate of the transistor QN0, when the low-side drive signal XN is low level.

The transistors QN5 and QN6 (first and second N-channel transistors) are connected in series between the gate of the transistor QN0 and the second node N2. The transistor QN5 has a gate connected to the third node N3, and enters an ON state in accordance with the bias potential that is supplied to the third node N3. The transistor QN6 has a gate to which the low-side drive signal XN is supplied, and supplies the second power supply potential VSS to the gate of the transistor QN0 via the transistor QN5, when the low-side drive signal XN is high level.

The transistor QN7 (third N-channel transistor) is connected between the third node N3 and the P-well 73, and the second power supply potential VSS is supplied to the gate thereof. The transistor QN7 maintains the transistor QN5 in an OFF state by reducing the potential of the third node N3 to the potential VPW of the P-well 73, when the potential VPW of the P-well 73 is lower than the second power supply potential VSS by greater than or equal to a threshold voltage. Leakage current can thereby be prevented by cutting off the transistor QN5, when the potential VPW of the P-well 73 is lower than the second power supply potential VSS by greater than or equal to a threshold voltage of the transistor QN7

Bias Potential Supply Circuit

The bias potential supply circuit 40 supplies a bias potential to the third node N3, in accordance with the control signal XE that is supplied from the control circuit 50. The bias potential supply circuit 40 includes, for example, P-channel MOS transistors QP2 to QP5. The transistor QP2

(second P-channel transistor) is connected between the first node N1 and the third node N3, and the control signal XE is supplied to the gate thereof. The transistor QP2 supplies current when the control signal XE is low level.

The transistors QP3 to QP5 shown as an example of a plurality of P-channel transistors are connected in series between the third node N3 and the second node N2. Each of the transistors QP3 to QP5 has a gate connected to a drain. The transistors QP3 to QP5 are supplied current from the transistor QP2, and generate a bias potential in the third node N3.

Leakage current can thereby be prevented from flowing in the bias potential supply circuit 40, as long as the control signal XE is high level, even if the potential VPW of the P-well 73 becomes lower than the second power supply potential VSS by greater than or equal to the threshold voltage of the transistor QN7, and the transistor QN7 enters an ON state in the pre-driver 30b.

Second Embodiment

Next, the second embodiment of the disclosure will be described.

Figure 3:
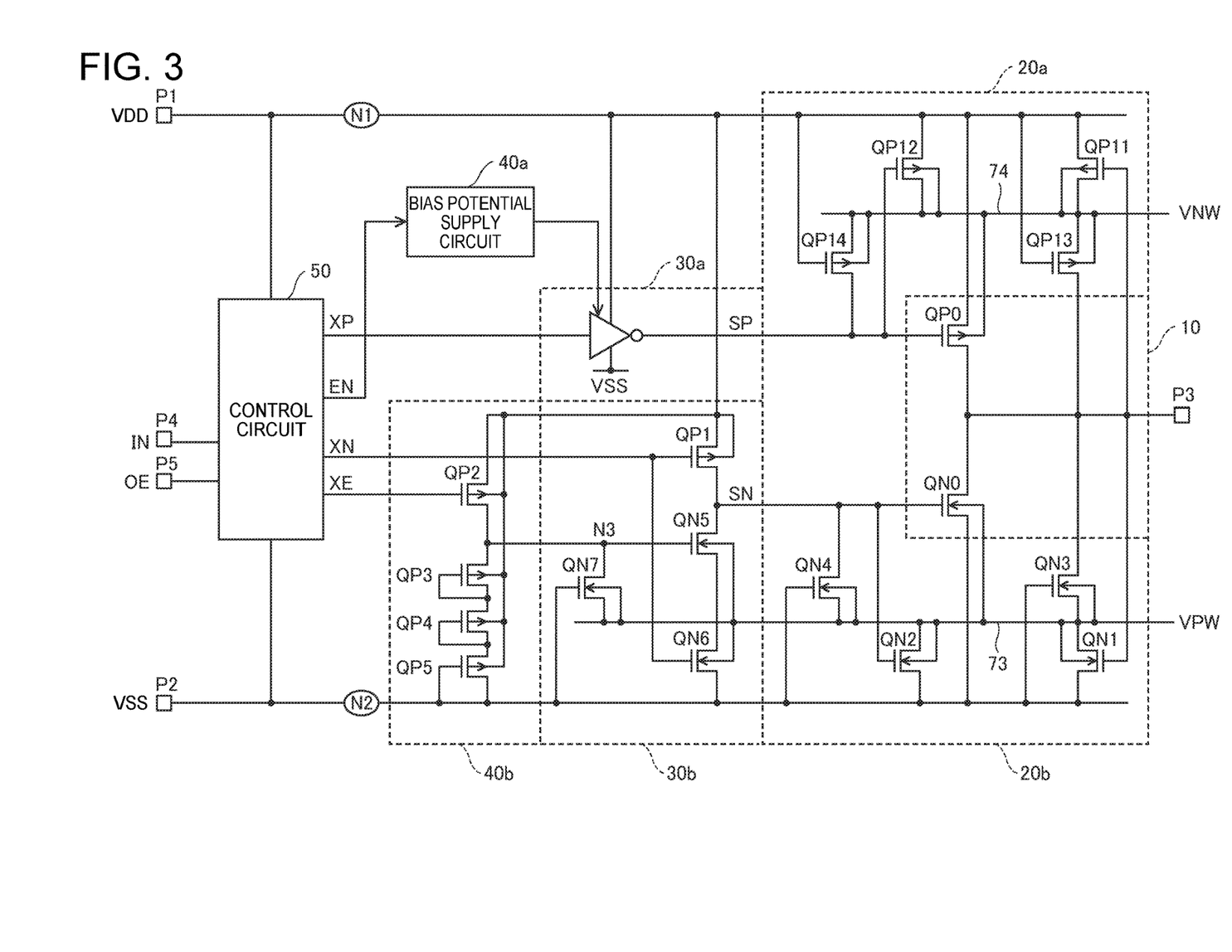
FIG. 3 is a circuit diagram showing a configuration example of a semiconductor device according to one embodiment.

FIG. 3 is a circuit diagram showing a configuration example of a semiconductor device according to a second embodiment of the disclosure. In the second embodiment, not only the second output element but also the first output element in the output driver 10 has a tolerant function. With regard to other points, the second embodiment may be configured similarly to the first embodiment.

As shown in FIG. 3, the output driver 10 has, for example, a transistor QP0 as a first output element and a transistor QN0 as a second output element. Here, a pN junction (parasitic diode) is formed by the drain and back gate of the transistor QP0. In the case where the back gate of the transistor QP0 is connected to the first node N1, leakage current will flow toward the first node N1 from the signal terminal P3 via the parasitic diode, when a potential higher than the first power supply potential VDD by greater than or equal to a forward voltage of the parasitic diode is applied to the signal terminal P3 from outside.

In order to prevent this, in the present embodiment, the transistor QP0 is provided in an N-well (floating N-well) 74 electrically separated from the semiconductor substrate. That is, the back gate of the transistor QP0 is constituted by the N-well 74, and the transistor QP0 has a tolerant function.

Also, in addition to a switch circuit 20b on the low side that is similar to the switch circuit 20 shown in FIG. 1, a switch circuit 20a on the high side is provided as a second switch circuit in the semiconductor device. The switch circuit 20a selectively supplies a potential to the N-well 74, according to at least the potential of the signal terminal P3.

Accordingly, in the case where a potential higher than the first power supply potential VDD on the high potential side is applied to the signal terminal P3 from outside, leakage current can be prevented from flowing to the first node N1 from the signal terminal P3 via the transistor QP0 by electrically separating the N-well 74 from the first node N1. As a result, it is possible to prevent malfunction of internal circuitry and breakdown of circuit elements of the semiconductor device.

For example, the switch circuit 20a may be configured to supply the first power supply potential VDD to the N-well 74, when the potential of the signal terminal P3 is at or below the first power supply potential VDD, and to maintain the transistor QP0 in an OFF state by supplying a potential to the N-well 74 and the gate of the transistor QP0 from the signal terminal P3, when the potential of the signal terminal P3 is higher than the first power supply potential VDD by greater than or equal to a predetermined value. Note that the above predetermined value corresponds to a threshold voltage of a P-channel MOS transistor which will be discussed later.

It is thereby possible, at the time of normal operation, to stabilize the operation of internal circuitry by supplying the first power supply potential VDD to the N-well 74, and, in the case where a potential higher than the first power supply potential VDD by greater than or equal to a predetermined value is applied to the signal terminal P3 from outside, to prevent leakage current by cutting off the transistor QP0.

In the example shown in FIG. 3, the switch circuit 20a includes P-channel MOS transistors QP11 to QP14. For example, by providing the transistors QP11 to QP14 in the N-well 74 similarly to the transistor QP0, the potential of the back gates of the transistors QP11 to QP14 is configured to be the same as the potential VNW of the N-well 74.

The transistor QP11 is connected between the first node N1 and the N-well 74, and the potential of the signal terminal P3 is supplied to the gate thereof. The transistor QP11 supplies the first power supply potential VDD to the N-well 74, when the potential of the signal terminal P3 is lower than the first power supply potential VDD by greater than or equal to a threshold voltage.

The transistor QP12 is connected between the first node N1 and the N-well 74, and the gate potential of the transistor QP0 is supplied to the gate thereof. The transistor QP12 supplies the first power supply potential VDD to the N-well 74, when the gate potential of the transistor QP0 is lower than the first power supply potential VDD by greater than or equal to a threshold voltage.

The transistor QP13 is connected between the signal terminal P3 and the N-well 74, and the first power supply potential VDD is supplied to the gate thereof. The transistor QP13 supplies a potential to the N-well 74 from the signal terminal P3, when the potential of the signal terminal P3 is higher than the first power supply potential VDD by greater than or equal to a threshold voltage.

In this way, by providing the transistors QP11 to QP13, it is possible, at the time of normal operation, to supply the first power supply potential VDD to the N-well 74 even if the potential of the signal terminal P3 transitions between high level and low level, and, when the potential of the signal terminal P3 is higher than the first power supply potential VDD by greater than or equal to a threshold voltage of the transistor QP13, to supply the potential of the signal terminal P3 to the N-well 74.

The transistor QP14 is connected between the N-well 74 and the gate of the transistor QP0 and between the N-well 74 and the gate of the transistor QP12, and the first power supply potential VDD is supplied to the gates thereof. The transistor QP14 is able to maintain the transistors QP0 and QP12 in an OFF state by supplying a potential to the gate of the transistor QP0 and the gate of the transistor QP12 from the N-well 74, when the potential VNW of the N-well 74 is higher than the first power supply potential VDD by greater than or equal to a threshold voltage. Leakage current can thereby be prevented by cutting off the transistors QP0 and QP12, when the potential VNW of the N-well 74 is higher than the first power supply potential VDD by greater than or equal to a threshold voltage of the transistor QP14.

Also, in addition a bias potential supply circuit 40b that is similar to the bias potential supply circuit 40 shown in FIG. 1, a bias potential supply circuit 40a is provided in the semiconductor device. For example, the pre-driver 30a and the bias potential supply circuit 40a on the high side are constituted by changing the configuration of the pre-driver 30b and the bias potential supply circuit 40b on the low side to the high side.

That is, in the pre-driver 30a and the bias potential supply circuit 40a on the high side, the p-channel MOS transistor and the N-channel MOS transistor are interchanged, the first power supply potential VDD and the second power supply potential VSS are interchanged, and the P-well 73 is changed to the N-well 74, in comparison with the pre-driver 30b and the bias potential supply circuit 40b on the low side.

Also, in addition to the control signal XE, the control circuit 50 outputs a control signal EN having a level inverted from the level of the control signal XE. The bias potential supply circuit 40a supplies a bias potential to the pre-driver 30a on the high side, in accordance with the control signal EN that is supplied from the control circuit 50.

Electronic Device

Next, an electronic device according to one embodiment of the disclosure will be described.

Figure 4:
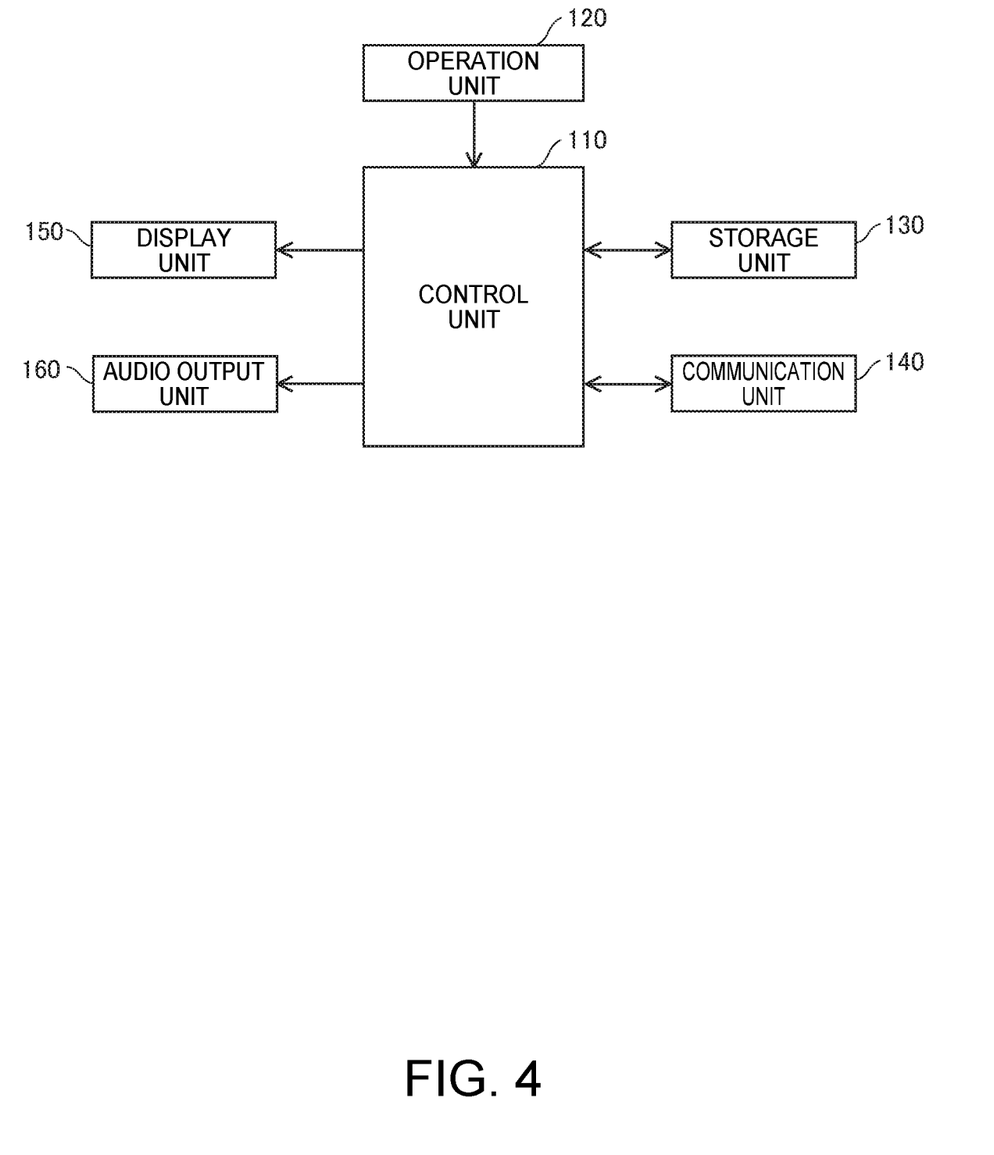
FIG. 4 is a block diagram showing a configuration example of an electronic device according to one embodiment.

FIG. 4 is a block diagram showing a configuration example of the electronic device according to one embodiment of the disclosure. As shown in FIG. 4, the electronic device includes a control unit 110, an operation unit 120, a storage unit 130, a communication unit 140, a display unit 150, and an audio output unit 160. Note that some of the constituent elements shown in FIG. 4 may be omitted or modified, or other constituent elements may be added to the constituent elements shown in FIG. 4.

The control unit 110 includes, for example, a CPU, and performs various types of signal processing and control processing in accordance with programs. For example, the control unit 110 controls the communication unit 140 in order to perform various types of signal processing according to operation signals that are supplied from the operation unit 120 or to perform data communication with an external apparatus. Alternatively, the control unit 110 generates image signals for causing the display unit 150 to display various types of images, and audio signals for causing the audio output unit 160 to produce various types of audio.

The operation unit 120 is, for example, an input device including operation keys, button switches and the like, and outputs operation signals according to operations by a user to the control unit 110. The storage unit 130 is constituted, for example, by a hard disk, various types of memories or the like, and stores programs and the like that are used in order for the control unit 110 to operate.

The communication unit 140 is constituted by analog circuitry and digital circuitry, and performs data communication with external devices, for example. The display unit 150 includes, for example, an LCD (liquid crystal display) or the like, and displays various types of information based on an image signal that is supplied from the control unit 110. The audio output unit 160 includes, for example, a speaker or the like, and generates audio based on an audio signal that is supplied from the control unit 110.

In an electronic device constituted in this way, the semiconductor device shown in FIG. 1 or FIG. 3 and a second semiconductor device that operates based on signals that are output from the signal terminal of the semiconductor device are used. For example, the communication unit 140 may be constituted by the semiconductor device shown in FIG. 1 or FIG. 3, and the control unit 110 may be constituted by the second semiconductor device. The communication unit 140 operates upon supply of the first power supply potential VDD on the high potential side and the second power supply potential VSS on the low potential side.

There are cases where the control unit 110 operates with a different power supply voltage from the communication unit 140, and outputs a signal having a potential lower than the second power supply potential VSS or a potential higher than the first power supply potential VDD to the signal terminal of the communication unit 140. Alternatively, there are also cases where undershoot or overshoot is included in signals that are output to the signal terminal of the communication unit 140 from the control unit 110, even if the control unit 110 and the communication unit 140 operate at the same power supply voltage.

According to the present embodiment, a highly reliable electronic device or the like can be provided, by using a semiconductor device that is able to prevent malfunction of internal circuitry and breakdown of circuit elements due to leakage current that occurs in the case where a potential lower than the second power supply potential VSS on the low potential side or a potential higher than the first power supply potential VDD on the high potential side is applied to the signal terminal.

Examples of the electronic device include a clock such as a table clock, a timer, a portable device such as a mobile phone or a personal digital assistant, an audio device, a digital still camera, a digital video camera, a television, a TV phone, a security television monitor, a head-mounted display, a personal computer, a printer, a network device, a multifunction peripheral, an in-vehicle device (navigation device, etc.), a calculator, an electronic dictionary, an electronic game machine, a robot, a measurement device, and a medical device (e.g., electronic thermometer, sphygmomanometer, blood glucose meter, electrocardiograph device, ultrasonic diagnostic apparatus, and electronic endoscope).

In the above embodiments, the case where a MOS transistor is used as the output element in the output driver was described, but a bipolar transistor or the like may be used as the output element. In his way, the invention is not limited to the embodiments described above, and many modifications can be made within the technical idea of the invention by a person having ordinary skill in the art.

What is claimed is:

1. A semiconductor device comprising:
   a first node to which a first power supply potential is supplied;
   a second node to which a second power supply potential lower than the first power supply potential is supplied;
   a signal terminal configured to output a signal;
   an output driver including a first output element configured to supply the first power supply potential to the signal terminal when in an ON state, and a second output element provided in a P-well electrically separated from a semiconductor substrate and configured to supply the second power supply potential to the signal terminal when in an ON state;
   a switch circuit configured to selectively supply a potential to the P-well, according to at least a potential of the signal terminal, the switch circuit comprising:
      a first transistor connected between the second node and the P-well, and configured to supply the second power supply potential to the P-well when the potential of the signal terminal is higher than the second power supply potential by greater than or equal to a first threshold voltage of the first transistor;
   a pre-driver configured to drive the second output element in accordance with a low-side drive signal, the pre-driver including:
      a P-channel transistor connected between the first node and a control terminal of the second output element, and configured to supply the first power supply potential to the control terminal of the second output element when the low-side drive signal is low level;
a first N-channel transistor and a second N-channel transistor connected in series between the control terminal of the second output element and the second node, the first N-channel transistor being configured to enter an ON state in accordance with a bias potential that is supplied to a third node, and the second N-channel transistor being configured to supply the second power supply potential to the control terminal of the second output element via the first N-channel transistor when the low-side drive signal is high level; and
a third N-channel transistor connected between the third node and the P-well, and configured to maintain the first N-channel transistor in an OFF state by reducing the potential of the third node to the potential of the P-well when the potential of the P-well is lower than the second power supply potential by greater than or equal to a threshold voltage; and
a bias potential supply circuit configured to supply the bias potential to the third node in accordance with a control signal, the bias potential supply circuit including:
a second P-channel transistor connected between the first node and the third node, and configured to supply current when the control signal is low level; and
a plurality of P-channel transistors connected in series between the third node and the second node, having a gate connected to a drain, and configured to generate the bias potential in the third node upon supply of a current from the second P-channel transistor.

2. The semiconductor device according to claim 1, wherein the switch circuit:
supplies the second power supply potential to the P-well when the potential of the signal terminal is at or above the second power supply potential, and
maintains the second output element in an OFF state by supplying a potential to the P-well and the control terminal of the second output element from the signal terminal when the potential of the signal terminal is lower than the second power supply potential by greater than or equal to a predetermined value.

3. An electronic device comprising:
the semiconductor device according to claim 2; and
a second semiconductor device configured to operate based on a signal that is output from the signal terminal of the semiconductor device.

4. The semiconductor device according to claim 1, wherein the switch circuit further comprises:
a second transistor connected between the second node and the P-well, and configured to supply the second power supply potential to the P-well when the potential of the control terminal of the second output element is higher than the second power supply potential by greater than or equal to a second threshold voltage; and
a third transistor connected between the signal terminal and the P-well, and configured to supply a potential to the P-well from the signal terminal when the potential of the signal terminal is lower than the second power supply potential by greater than or equal to a third threshold voltage.

5. The semiconductor device according to claim 4, wherein the switch circuit further includes a fourth transistor connected between the P-well and the control terminal of the second output element and between the P-well and a gate of the second transistor, and configured to maintain the second output element and the second transistor in an OFF state by supplying a potential to the control terminal of the second output element and the gate of the second transistor from the P-well when the potential of the P-well is lower than the second power supply potential by greater than or equal to a fourth threshold voltage.

6. An electronic device comprising:
the semiconductor device according to claim 5; and
a second semiconductor device configured to operate based on a signal that is output from the signal terminal of the semiconductor device.

7. An electronic device comprising:
the semiconductor device according to claim 4; and
a second semiconductor device configured to operate based on a signal that is output from the signal terminal of the semiconductor device.

8. The semiconductor device according to claim 1, wherein the first output element is provided in an N-well electrically separated from the semiconductor substrate, and
the semiconductor device further comprises a second switch circuit configured to selectively supply a potential to the N-well according to at least the potential of the signal terminal.

9. An electronic device comprising:
the semiconductor device according to claim 8; and
a second semiconductor device configured to operate based on a signal that is output from the signal terminal of the semiconductor device.

10. The semiconductor device according to claim 1, further comprising:
an input circuit configured to input a signal from the signal terminal.

11. An electronic device comprising:
the semiconductor device according to claim 10; and
a second semiconductor device configured to operate based on a signal that is output from the signal terminal of the semiconductor device.

12. An electronic device comprising:
the semiconductor device according to claim 1; and
a second semiconductor device configured to operate based on a signal that is output from the signal terminal of the semiconductor device.

13. A semiconductor device comprising:
a first node to which a first power supply potential is supplied;
a second node to which a second power supply potential lower than the first power supply potential is supplied;
a signal terminal configured to output a signal;
an output driver including a first output element provided in an N-well electrically separated from a semiconductor substrate and configured to supply the first power supply potential to the signal terminal when in an ON state, and a second output element configured to supply the second power supply potential to the signal terminal when in an ON state;
a switch circuit configured to selectively supply a potential to the N-well, according to at least a potential of the signal terminal, the switch circuit comprising:
a first transistor connected between the first node and the N-well, and configured to supply the first power supply potential to the N-well when the potential of the signal terminal is lower than the first power supply potential by greater than or equal to a first threshold voltage of the first transistor;

a pre-driver configured to drive the second output element in accordance with a high-side drive signal, the pre-driver including:
  a P-channel transistor connected between the first node and a control terminal of the second output element, and configured to supply the first power supply potential to the control terminal of the second output element when the high-side drive signal is low level;
  a first N-channel transistor and a second N-channel transistor connected in series between the control terminal of the second output element and the second node, the first N-channel transistor being configured to enter an ON state in accordance with a bias potential that is supplied to a third node, and the second N-channel transistor being configured to supply the second power supply potential to the control terminal of the second output element via the first N-channel transistor when the high-side drive signal is high level; and
  a third N-channel transistor connected between the third node and a P-well, and configured to maintain the first N-channel transistor in an OFF state by reducing the potential of the third node to the potential of the P-well when the potential of the P-well is lower than the second power supply potential by greater than or equal to a threshold voltage; and
a bias potential supply circuit configured to supply the bias potential to the third node in accordance with a control signal, the bias potential supply circuit including:
  a second P-channel transistor connected between the first node and the third node, and configured to supply current when the control signal is low level; and
  a plurality of P-channel transistors connected in series between the third node and the second node, having a gate connected to a drain, and configured to generate the bias potential in the third node upon supply of a current from the second P-channel transistor.

* * * * *